United States Patent [19]
Milor et al.

[11] Patent Number: 5,886,909
[45] Date of Patent: Mar. 23, 1999

[54] DEFECT DIAGNOSIS USING SIMULATION FOR IC YIELD IMPROVEMENT

[75] Inventors: Linda Milor, Stanford; Yeng-Kaung Peng, Los Altos; Khoi Anh Phan, San Jose; David Steele, Sunnyvale, all of Calif.

[73] Assignee: Advanced Micro Devices, Inc., Sunnyvale, Calif.

[21] Appl. No.: 994,960

[22] Filed: Dec. 19, 1997

[51] Int. Cl.$^6$ ...................................................... G06F 17/50
[52] U.S. Cl. ............... 364/578; 364/468.17; 364/468.28; 356/237
[58] Field of Search ..................................... 364/578, 498, 364/468.28, 468.17; 356/237, 300, 308

[56] References Cited

U.S. PATENT DOCUMENTS

| | | | |
|---|---|---|---|
| 5,585,210 | 12/1996 | Lee et al. ..................................... | 430/5 |
| 5,586,039 | 12/1996 | Hirsch et al. ....................... | 364/468.01 |
| 5,808,735 | 9/1998 | Lee et al. .................................. | 356/237 |

OTHER PUBLICATIONS

Article Entitled, Photoresist Defect Diagnosis Using a Rigorous Topography Simulator, Author: Milor et al.
Article Entitled, Photoresist Process Optimization For Defects Using A Rigorous Lithography Simulator, Author: Milor et al.
Article Entitled, The Application Of Lithography Defect Simulation To Submicron CMOS Yield Improvement Efforts, Author: Milor et al.

Primary Examiner—Kevin J. Teska
Assistant Examiner—Thai Phan
Attorney, Agent, or Firm—Brinks Hofer Gilson & Lione

[57] ABSTRACT

Defects in integrated circuit wafers (10) are often difficult to diagnose, because patterned wafer inspections can only be done after certain wafer processing steps. Defect simulation is used to understand the relation between defects in the wafer (10) and the resulting wafer profiles. Defects such as particles (50) and bubbles (22) in the photoresist (28), for example, translate into a wide variety of defective profiles. Knowledge of the relation between defects and the defect profiles can assist in yield improvement efforts, since defects may be diagnosed by comparing simulated and observed defect profiles. From the simulated defect profiles, methods can be adapted to fix or correct observed defects.

27 Claims, 7 Drawing Sheets

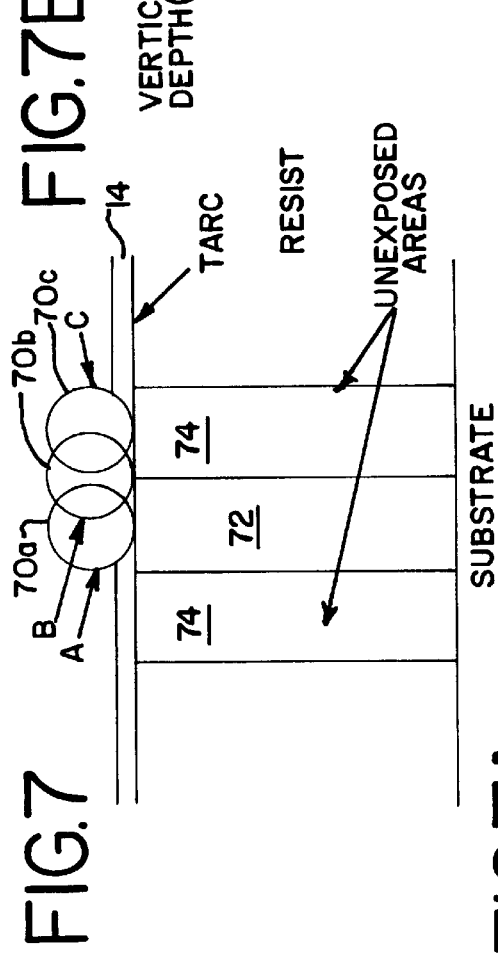
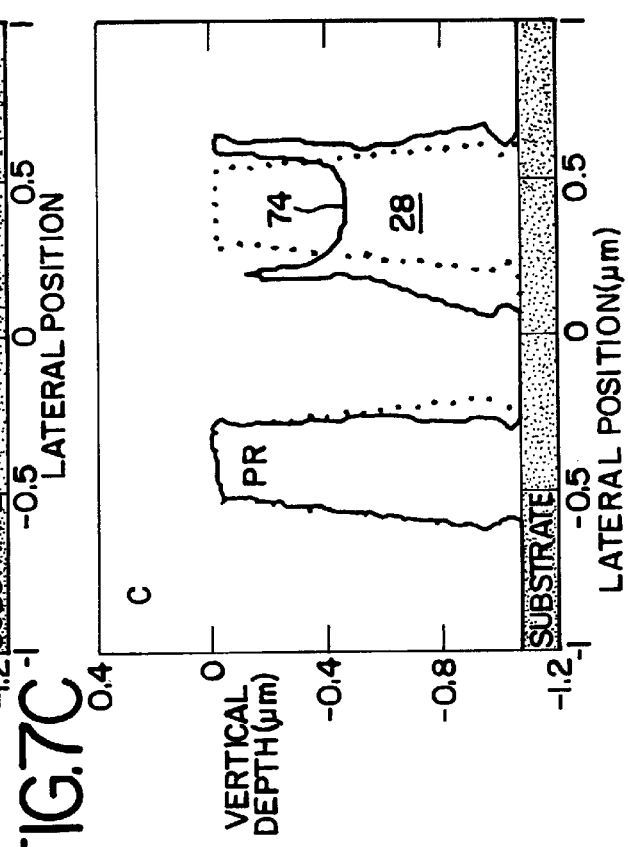
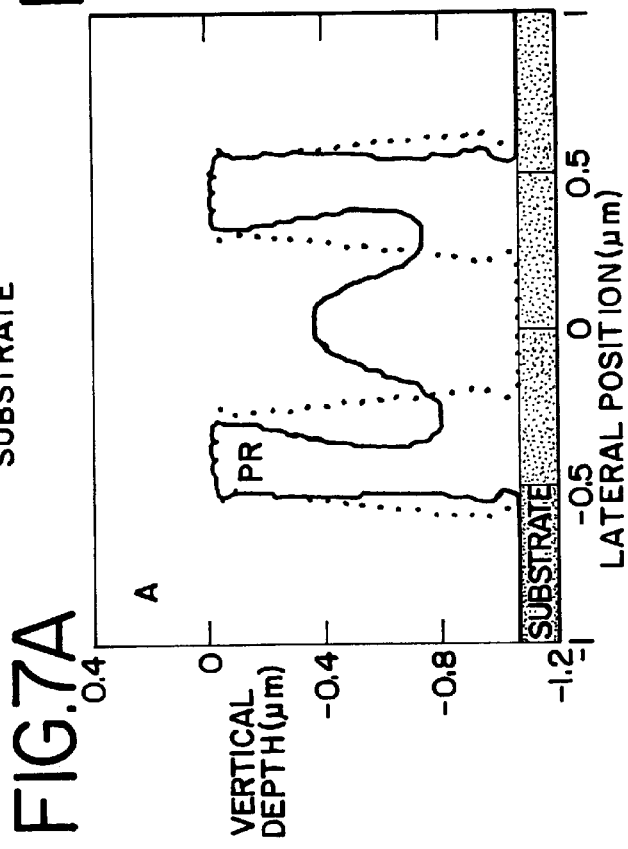
FIG. 7
FIG. 7A
FIG. 7B
FIG. 7C

DEFECT DIAGNOSIS USING SIMULATION FOR IC YIELD IMPROVEMENT

FIELD OF THE INVENTION

This invention relates to the field of integrated circuit processing, and more particularly, to the detection and correction of defects that occur during wafer fabrication.

BACKGROUND OF THE INVENTION

Defects are major causes of yield loss for all integrated circuit ("IC") products. The focus of yield improvement efforts is to identify and eliminate major yield limiters. This is done, in part, by scanning a sample of IC wafers with in-line scanners and classifying defects. The most common defect types are identified, after which an effort is made to find the source of these common defects and fix the problem.

Identifying a cause of a defect is usually the most time consuming and costly component of yield improvement efforts. Some defect types are not too difficult to diagnose. Easy to diagnose defects include those caused by particles. Such defects are often still present during in-line inspection. Consequently, the particle composition can be determined by known techniques, such as energy dispersion spectroscopy analysis.

On the other hand, some defect types are difficult to diagnose because they leave their imprint by distorting the physical topography of the water surface. These defects may also no longer be present at a step where inspection can be performed, which makes identification difficult. Examples of such defects can include bubbles and particles in the photoresist layer of the IC. As those skilled in the art will appreciate, diagnosis of defects in the photoresist layer is difficult because photoresist can only be inspected after it is developed. Moreover, bubble and particle defects in the photoresist often do not appear as bubbles or particles after the photoresist is developed, but may take on some other distorted shape or appearance, which further complicates diagnosis.

Because defect diagnosis is difficult if the defects causing a distorted wafer profile are no longer present during inspection, yield learning typically involves running pre-designed experiments. Such experiments commonly involve processing sets of wafers with different fabrication recipes. Often, the number of wafers used in such experiments is limited, however, in order to save material costs. But if too few wafers are used, experimental results may turn out to be inconclusive thus frustrating defect diagnosis and yield improvement. Defect simulation can thus provide guidance for such experimental work by eliminating some of the competing theories about the causes of certain defects.

In addition, submicron lithography defect simulation has been known to provide insight about how defects of different sizes and types can distort expected wafer profiles. Through the use of lithography simulation, defect causes can be identified and verified by comparing the simulation results with observed wafer profiles. Both the insight and data gained from lithography simulation, such as when and how defects cause shorts or opens, and the nature of the distorted patterns the defects cause, can assist in yield improvement efforts.

Topography simulations of photoresist bubbles have been performed using the Metropole lithography simulator developed at Carnegie Mellon University. Among the capabilities of this simulator is a two-dimensional modeling of in-line aerial imaging, exposure of photoresist, and development of photoresist. The quantitative accuracy of the defect simulations was verified by simulating particles of various sizes in the photoresist. Experiments were then performed to recreate the photoresist defects in actual IC wafers. These experimental results were found to correlate and match those from the simulations.

Once the simulator is tuned to the experimental data, it can be used to run further experiments to observe how a wide variety of defects are likely to impact photoresist profiles. The results from simulations of various defects, such as the impact of bubbles and particles in the photoresist and on top of the photoresist layer, can then be employed to determine and correlate simulated defects with observed defects. This has been done for individual defects and for similar groupings of related defect types.

What is needed is a method or technique for cataloging or storing a host of defect simulations that can then be used to diagnose the wide variety of defects encountered in a production environment. The catalog would include entries for known defects, and a profile of the simulated effect of such defect in IC processing. Observed defects could then be matched with the simulated defect effects. Once a match of simulated and observed effects is found, the associated cause of the defect can be readily identified. Such a catalog or library of defect profiles would help cut down the time required to identify the cause of a defect. Moreover, known techniques can then be applied to correct the particular defect identified.

SUMMARY OF THE INVENTION

In view of the above, the present invention provides a method for defect diagnosis using simulation for wafer yield improvement. In one aspect of the invention, a method is provided of diagnosing defects that impact topography of an integrated circuit wafer surface. An integrated circuit wafer surface is scanned after predetermined processing steps have been performed on the wafer, and any defect data detected from the scanned wafer is stored in a defect profile. The stored defect profile is compared against a library of wafer surface defect types based on known wafer defect characteristics to identify a possible cause for the defect profile. Predetermined experiments are run in order to narrow the number of feasible defect causes for the defect profile. The wafer surface defects can then be fixed according to known techniques based on the specific feasible defect causes identified.

According to another aspect of the invention, a method of developing a library of defects in integrated circuits is provided. A defect simulator is calibrated to match nominal wafer data for a non-defective integrated circuit. Plural defect simulations are executed to determine the effect of changes in size and composition of known defects. From the simulations, defect profiles of common defects and their characteristics are developed based on the defect simulations. These defect profiles are then stored in a library for later comparison of the defect profiles against actual wafer defects. At such time, potential defect profiles are classified as feasible or infeasible causes of the actual water defects based on the comparison. Predetermined experiments are then performed to narrow down the set of feasible causes for the actual defects.

In yet another aspect of the invention, a method is provided of diagnosing defects in integrated circuits that impact doping concentrations. Integrated circuit wafer electrical test data is first measured, and a determination is made to see if at least one wafer site demonstrates bad wafer electrical test data. A simulator is then calibrated to match nominal wafer electrical test data. Plural defect simulations are performed, which can be used to compare simulated data with measured wafer electrical test data. The defect simulation results are classified as feasible or infeasible causes of the bad wafer electrical test data. Predetermined tests are performed to narrow the set of feasible causes of the bad wafer electrical test data by using different known test structures. The identified defect can then be fixed according to known techniques.

The cataloging of a host of defect simulations can be used to diagnose a wide variety of defects encountered in an IC production environment. The catalog thus includes entries for known defects, and a profile of the simulated appearance of such defect in IC processing. Defects encountered during manufacturing can then be matched with the simulated defect appearances. Once a match of simulated and observed defect appearances is found, the associated cause of the defect is readily identified.

The catalog of defect profiles can be stored in a computer memory to further automate the defect detection process. Such a library of defect profiles would help to cut down the time required to identify the cause of a defect, and thus the time and costs associated with IC yield improvement efforts. Once the defect type is identified, known techniques can then be applied to correct a particular defect.

These and other features and advantages of the invention will become apparent upon review of the following detailed description of the presently preferred embodiments of the invention taken in conjunction with the appended drawings.

BRIEF DESCRIPTION OF THE DRAWINGS

FIG. 2(A) shows a bubble located far from the substrate and close to the surface, and FIG. 2(C) shows a bubble close to unexposed areas of the photoresist layer.

FIG. 7 shows block cross-sections and the simulations of 0.4 $\mu$m photoresist particles on the wafer surface in differing positions, where FIG. 7(A) shows the effect of a particle in position A, FIG. 7(B) shows the effect of a particle in position B, and FIG. 7(C) shows the effect of a particle in position C.

FIG. 9(B) illustrates the flow of detecting a defect in wafer doping concentrations.

DETAILED DESCRIPTION OF THE PRESENTLY PREFERRED EMBODIMENTS

Figure 1:
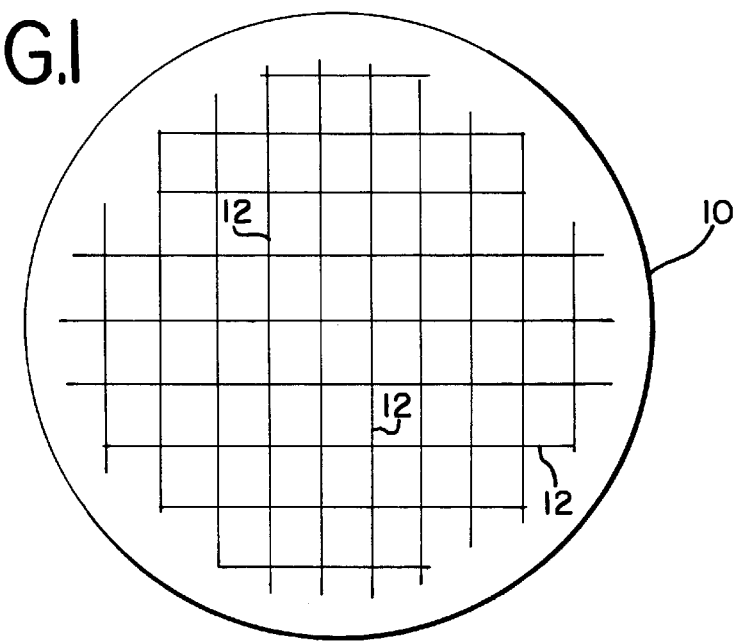
FIG. 1 is a plan view of a semiconductor integrated circuit wafer after predetermined processing steps have been performed on the wafer.

Referring now to the drawings, where like reference numerals refer to like elements throughout, a semiconductor integrated circuit wafer 10 is shown in FIG. 1. The wafer 10 in FIG. 1 is shown in plan view and displays a wafer 10 after predetermined processing steps have been performed on the wafer 10. In the presently preferred embodiment of the invention, the wafer 10 is examined and simulated after the photoresist layer has been deposited on the wafer surface. As those skilled in the art will appreciate, however, the teachings of the invention can be applied after any number of processing steps have been performed on the wafer 10 depending on the nature of the defect observed and its relative location in the processing steps of the IC wafer 10.

As mentioned above, defects of various kinds are simulated and the simulations are stored for later comparison to observed defects. Prior to the storage of a simulated defect, however, the simulation is first compared against an experimentally created defect. This is done to verify that the simulation in fact accurately represents an actual defect. Once the simulation is confirmed, the profile of the simulated defect can be used for comparison to observed defects encountered during wafer production. In the presently preferred embodiment of the invention, the Metropole defect simulator, developed by Carnegie-Mellon University, is employed to create the simulated defects.

With the presently preferred Metropole simulator, the propagation of light within the photoresist layer is described by Maxwell's equations, which are solved using a waveguide method so that systems with high numerical aperture ("NA") can be modeled accurately. When tuning the Metropole simulator to in-line wafer profiles, the aerial imaging parameters are preferably set according to existing process recipes. In the presently preferred embodiment, an 5-layer metal, 0.35 micron, Complementary Metal Oxide Semiconductor process is used. Similarly, the photoresist exposure parameters, i.e. Dill's parameters, provided by the photoresist manufacturer, Shipley Co. of Marlboro, Mass., were entered into the simulator. The parameters that describe the development rate of the presently preferred I-Line photoresist are less exact, but have nevertheless been chosen according to the manufacturer's specifications.

After setting the develop time, in order to make the simulated profiles match those seen in the fabrication facility, parameters in the Mack model were found by calibrating the simulator to experimental data, i.e., optimizing the fitting of the simulated profiles to the observed profiles. In addition, the quantitative accuracy of the defect simulations was verified by simulating defects of various sizes in the photoresist as mentioned above. Experimental results were then compared to those obtained from the simulations, and were found to correlate.

Figure 3A:
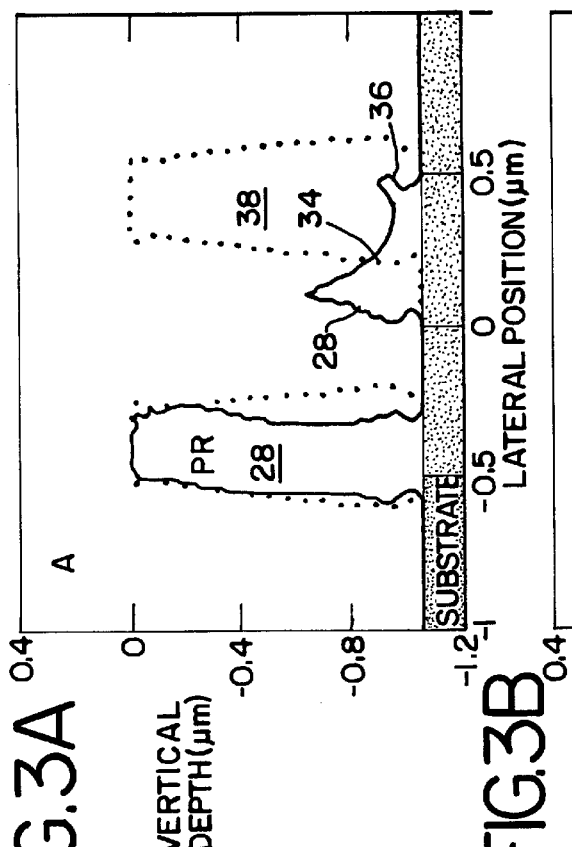
FIGS. 3A and 3B show further simulations of 0.2 $\mu$m bubbles in the photoresist layer, where the bubble shown in FIG. 3(A) is to the left of the bubble shown in FIG. 3(B), and both bubbles are between the bubbles shown in FIGS. 1 and 2.
Figure 3B:
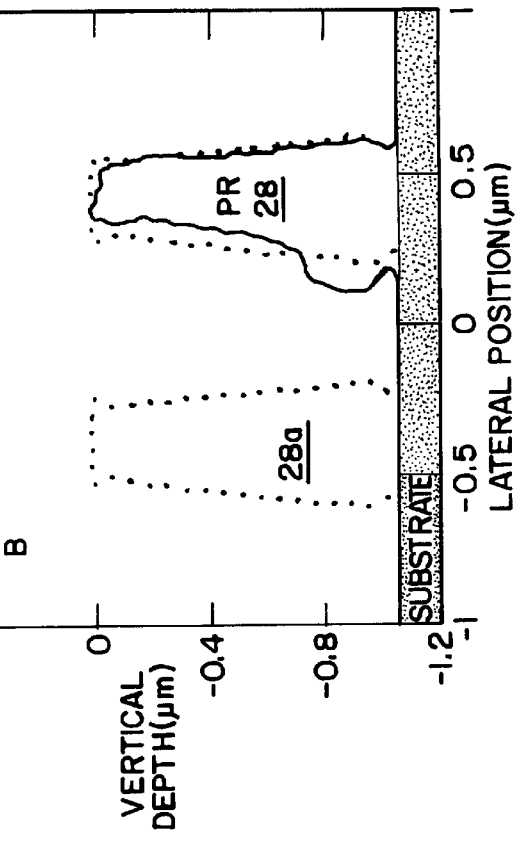
Figure 2C:
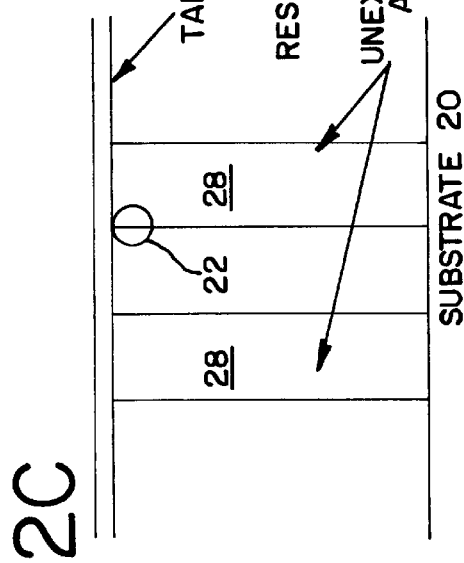
Figure 2D:
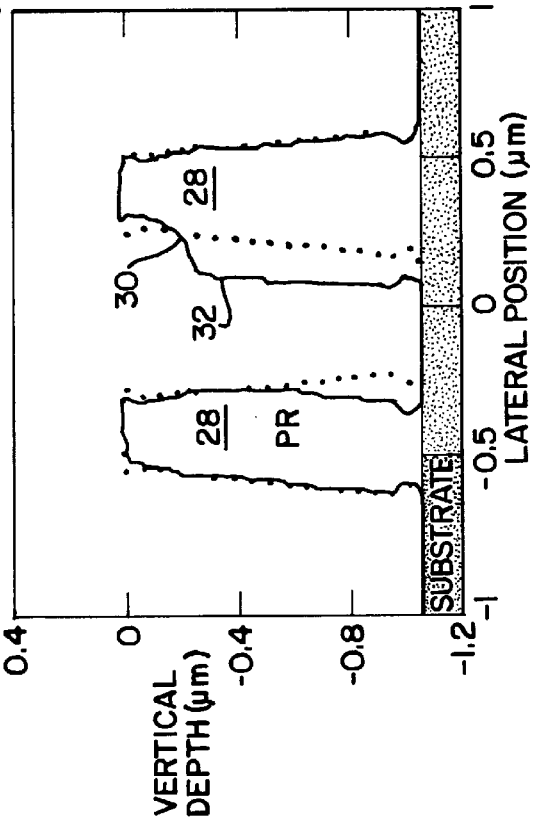
Figure 4A:
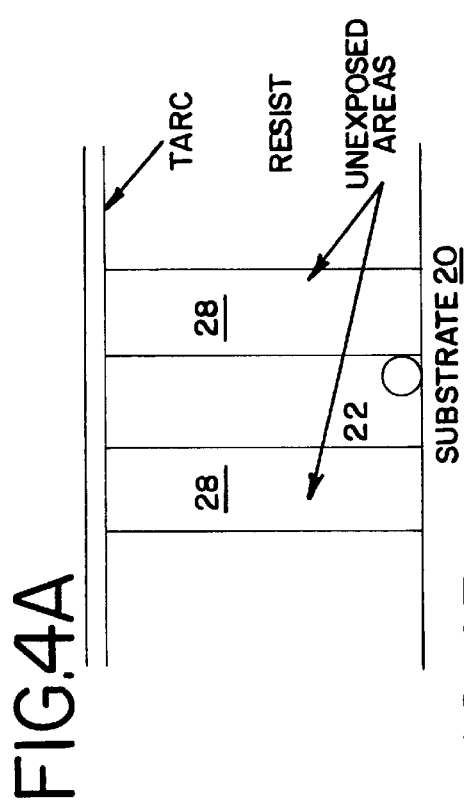
FIGS. 4A and 4B show another block cross-section and simulation of a 0.2 $\mu$m bubble in the photoresist layer where the bubble is located closer to the substrate.
Figure 4B:
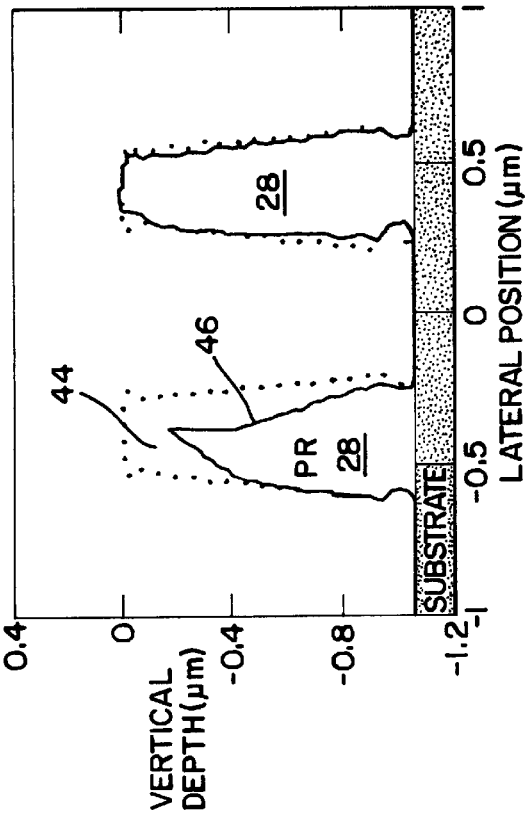
Figure 6:
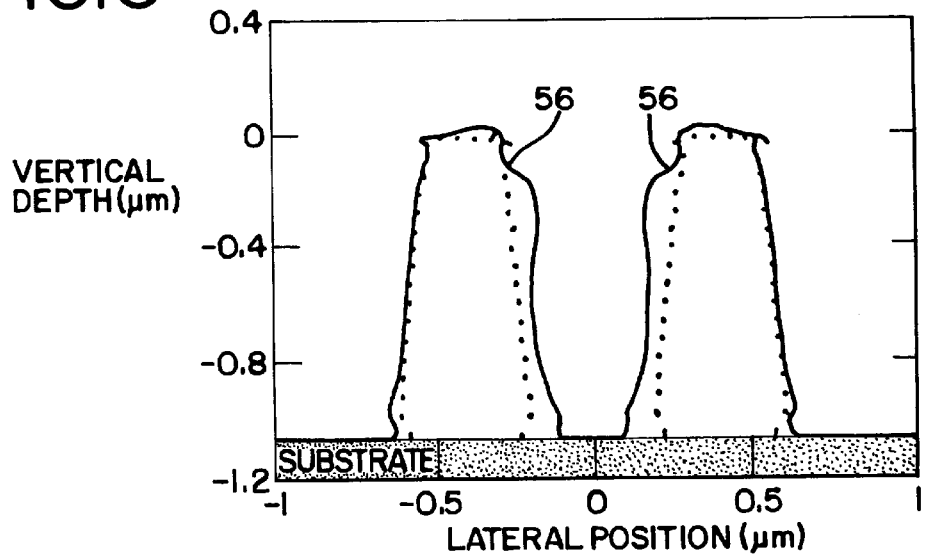
FIG. 6 shows another simulation of a 0.1 $\mu$m nitride particle in a 0.4 $\mu$m space between resist lines.
Figure 8A:
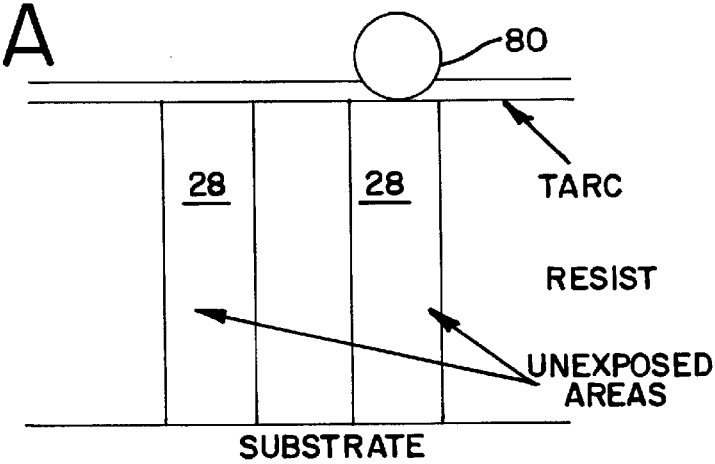
FIGS. 8A and 8B show a block cross-section and simulations of 0.4 $\mu$m tungsten particle located on the wafer surface.
Figure 8B:
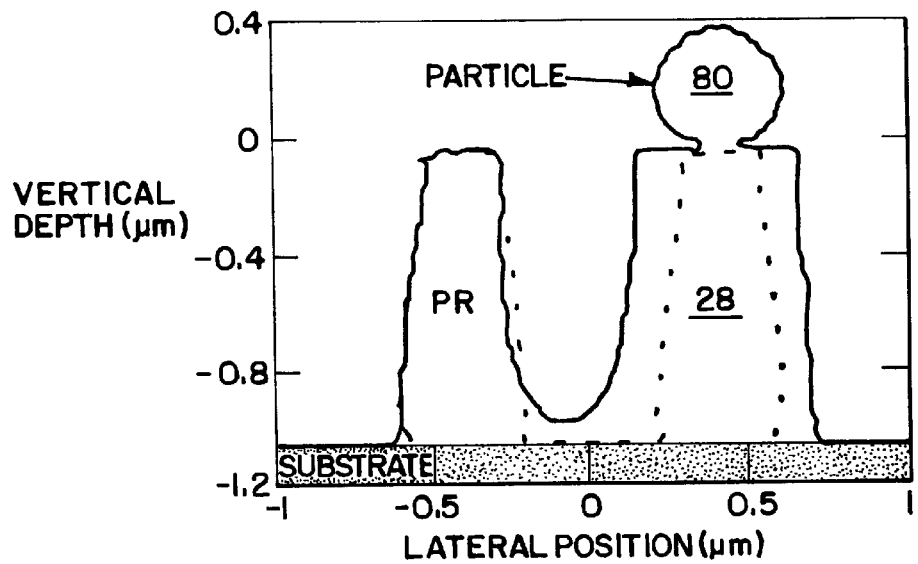

Examples of some of the defects detected in the preferred embodiment are shown in FIGS. 2–8. In FIGS. 2–4, for example, the effects of 0.2 $\mu$m bubbles in the photoresist layer of the wafer 10 are considered. These bubbles can appear in the vicinity of lines 12 (FIG. 1) that are preferably 0.4 $\mu$m wide and preferably separated by 0.4 $\mu$m. The thickness of the photoresist (not shown) is also preferably slightly over 1 $\mu$m. For each defect shown in the drawings, a block cross-section of the location and nature of the defect is shown along with the simulated effect of the defect compared against a nominal (non-defective) case (shown in phantom lines). The simulation results shown in FIGS. 2(A) and 2(B), for example, are profiles which represent cross-sections of photoresist lines. The diagrams outline the physical boundary 14 between air and photoresist 28, the defect 22, and the substrate 20 after the photoresist 28 is developed.

Figure 2A:
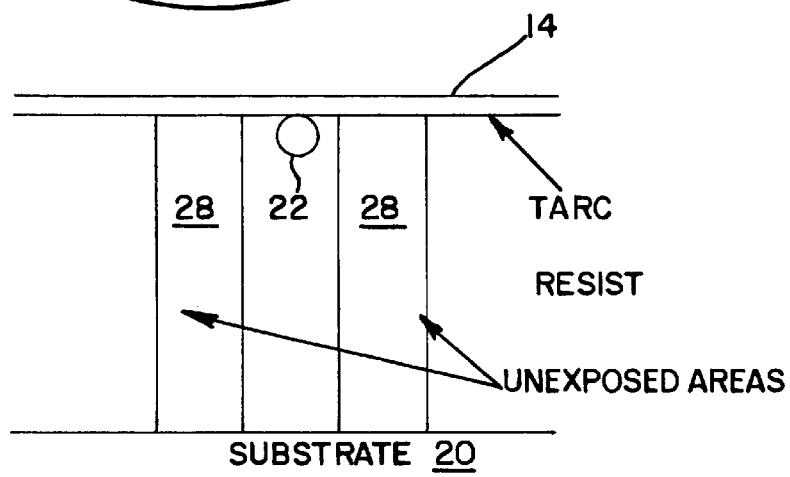
FIGS. 2A, 2B, 2C and 2D show a block cross-section and the simulation of a 0.2 $\mu$m bubble in the photoresist layer of the integrated circuit wafer shown in FIG. 1, where
Figure 2B:
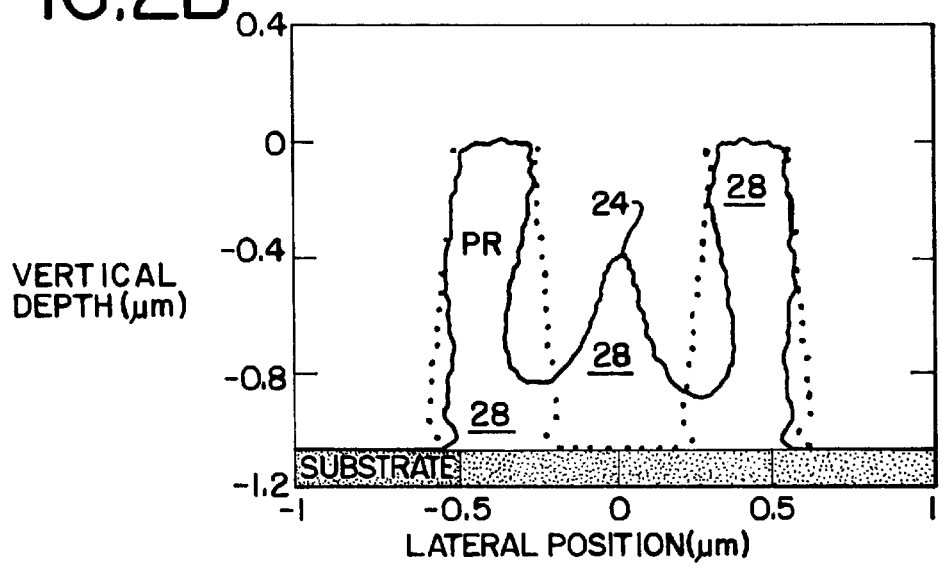

Referring to FIG. 2(A), defects in the form of bubbles 22 located between unexposed areas of photoresist 28 are known to cause bridging 24 effects if located far from the substrate 26 and close to the photoresist surface 28. The bubble 22 in the photoresist 28 blocks the exposure of the photoresist 28 beneath the bubble 22. This occurs because of reflections off the bubble 22 itself. The simulation of this defect type shown in FIG. 2(A) tracks this known characteristic. A photoresist bubble 22 located close to unexposed areas of the photoresist 28 causes notching 30 and widening 32 of photoresist profiles below the bubble 20. Again, the widening of photoresist profiles results because the reflection of light off the bubble 22 blocks exposure of the photoresist 28 below it. The simulation shown in FIG. 2(B) accurately represents this type of defect profile. The resulting simulation of the defective photoresist profile caused by the appearance of bubbles 22 in the various locations of the photoresist 28 can be stored in a computer and compared with actual wafer profiles, as described in more detail below.

In FIG. 3, the impact of a bubble near the photoresist surface is simulated in various positions. The simulations shown in FIGS. 3(A) and 3(B) correspond to bubbles 22 that are located between those shown in FIGS. 2(A) and 2(B). In particular, instead of widening photoresist profiles, the defect location in FIG. 3(A) results in an almost complete development 34 of one of the photoresist lines 28, except for some residual photoresist 36 directly under the bubble. Two-dimensional simulations of smaller bubbles in the same location indicate that the bubble results in a very deep notch 38 in the photoresist line 28, with some bridging to the adjacent photoresist line 28 near the sides of the notch 38 (FIG. 3(B)). These effects are known to occur because exposure of the photoresist 28 near the sides of the bubble 22 is blocked by the bubble 22 itself. Similarly, the defect simulated in FIG. 3(B) results in a very deep notch or total break in the adjacent photoresist line 28a, without the presence of any bridging.

If the bubble 22 defect is deposited closer to the substrate 20, as shown in FIG. 4, the impact or effect of the bubble 22 is position dependent, and in the worst case such a bubble 22 can result in notching. The bubble 22 in FIG. 4 seems to cause a circular notch 44 in a photoresist line 28. The notch 44 is a result of reflection and scattering off of the defect towards the top of a nearby photoresist line 28. This scattering also results in a significant lowering of the PAC concentration at the top of the line, which consequently gets developed away 46.

Figure 5A:
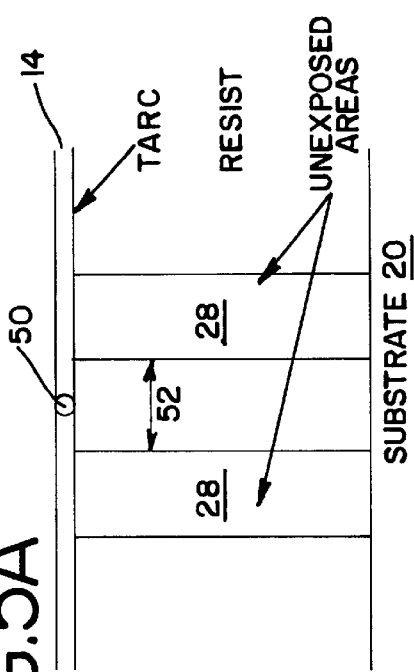
FIGS. 5A and 5B show a block cross-section and the simulation of a 0.1 $\mu$m tungsten particle in a 0.4 $\mu$m space between resist lines.
Figure 5B:
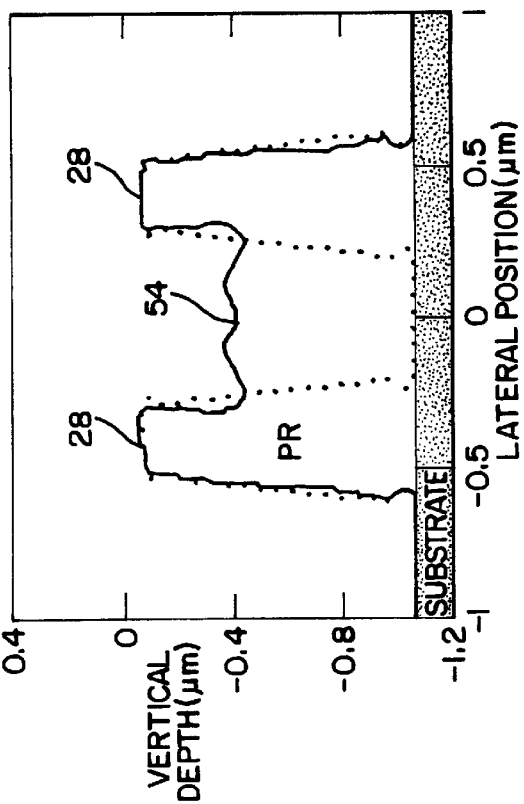

Other defects, besides bubbles 22, have been known to occur in the photoresist layer 28. Because 0.1 µm filters are common in industry, it may be impossible to filter out all particles. The impact of highly reflective 0.1 µm particles can also be simulated, as shown in FIGS. 5–8. Referring to FIG. 5, the worst case location for 0.1 µm particles 50 is in the spaces 52 between photoresist lines 28, since particles 50 in such locations can block or partially block exposure of the photoresist 28. As a result, in the presence of particles 50, all photoresist 28 below the clear portion of the mask (not shown) may not get developed.

In FIG. 5, a simulated profile resulting from a 0.1 µm particle 50 that is centered in the exposed space 52 between the two photoresist lines 28 is shown. As with the simulation results for photoresist bubbles 22 (FIGS. 2–4), these photoresist lines 28 are preferably 0.4 µm wide and preferably separated by 0.4 µm. As shown in FIG. 5, the photoresist 28 under the particle 50 is not fully developed and bridging 54 thus occurs between photoresist lines 28. As with the bubble 22 defects, the simulation also shows in phantom lines the nominal appearance of the photoresist lines 28 without any defect. The resulting defect profile from these simulations can also be stored and later used for comparison with actual wafer profiles.

As with bubbles 22 in the photoresist 28, the impact of particles 50 is also position dependent. In particular, the bridging 54 between lines 28 is more likely when the particle 50 is near the surface 14, and far from the substrate 20. If the particle 50 is not centered in the exposed area, bridging 54 is less likely. The composition of the particle 50 also affects the resulting photoresist profile. The simulation results shown in FIG. 5 represent tungsten and silicon particles 50, whose index of refraction differs significantly from that of the photoresist 28. If, on the other hand, the index of refraction of the material of the particle 50 is closer to that of photoresist 28, the effect is much less severe. Specifically, 0.1 µm oxide particles 50, whose index of refraction is slightly below that of the photoresist 28, seem to have no impact on the photoresist profiles. If the index of refraction of the particle 50 is slightly above that of the photoresist 28, such as for nitride particles, only minor notching 56 of the photoresist profiles are observed. These effects can also be simulated (see FIG. 6).

When the 0.1 µm filters are defective it is also possible to observe large particles 50 on the surface 14 of the photoresist 28. For example, a bowl-like shape made entirely of photoresist 28 may occur surrounded by a circle of undeveloped photoresist. In FIGS. 7(A)–(C), the position of a large 0.4 µm photoresist particle 70 is varied and the simulated effects are shown. When the particle 70a is centered over an exposed area 72, it blocks the exposure (FIG. 7(A)). On the other hand, if the particle 70c is centered over an unexposed area 74 (FIG. 7(C)), the imprint of the particle 70, after development, appears as a developed area 74, directly under the particle 70, bordered by the unexposed photoresist 28. The exposed area under the particle 70 is not caused by reflections off the substrate 20, which are in turn reflected off the lower surface of the particle 70. Instead, light hitting the sides of the particle 70 is refracted and focused under the particle 70. Particles made of other materials with similar refractive properties to photoresist 28, like oxide and nitride, will result in similar photoresist patterns. The resulting photoresist profiles can also be used for comparison with actual wafer profiles, as described below.

This defect pnenomenon is further illustrated by comparing simulation results of a tungsten particle with those of a photoresist particle. The tungsten particle results in widening of the photoresist line 28, but has no developed area under the particle 80 (see FIG. 8).

Figure 9A:
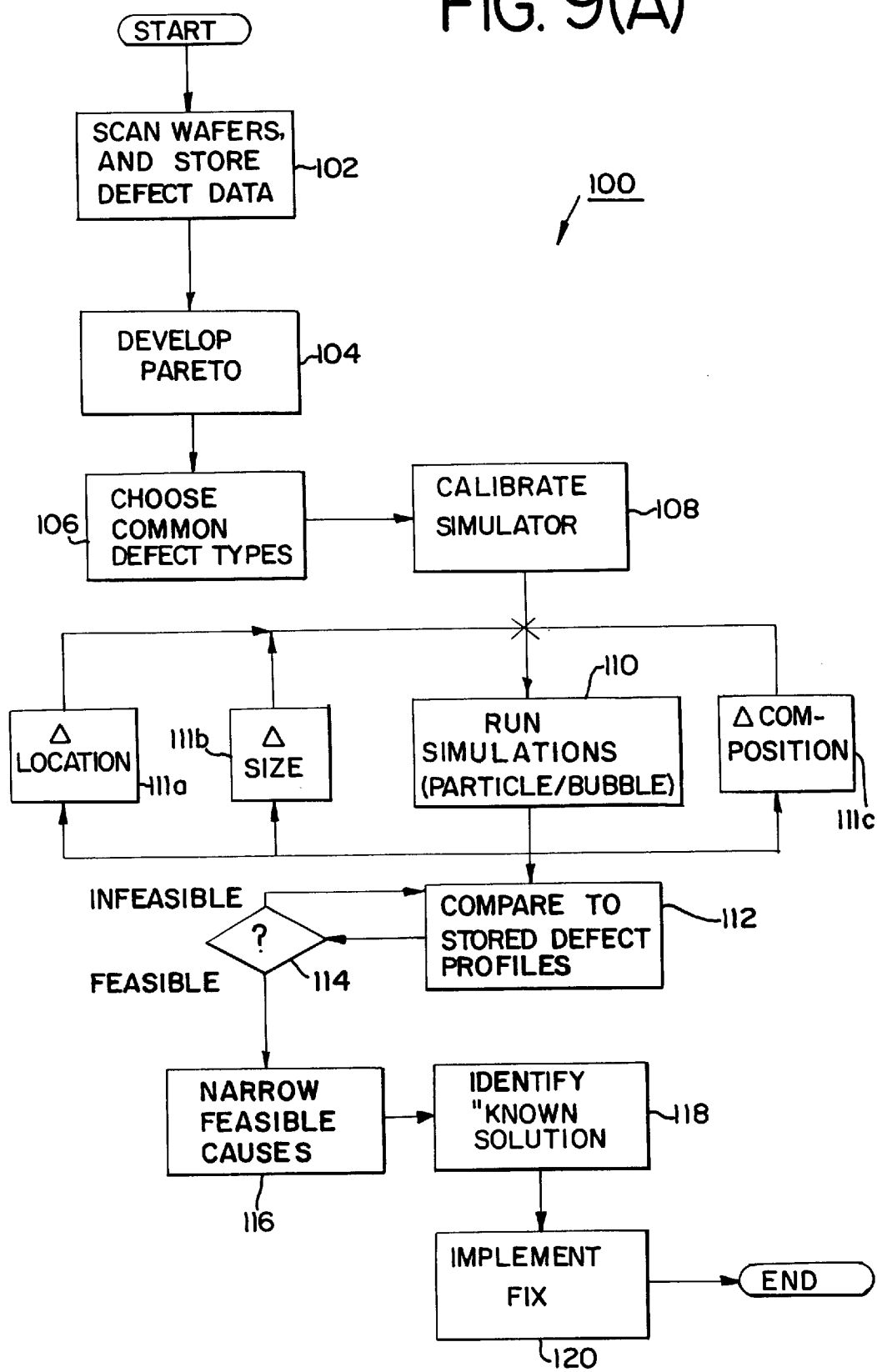
FIGS. 9A and 9B are flow charts of the presently preferred method of the invention, where FIG. 9 (A) illustrates the flow of detecting a defect in wafer topography.

Turning now to FIG. 9, one presently preferred flow chart of the process of storing and comparing the simulated defect profiles against in-line wafers 10 is shown. Referring first to FIG. 9(A), a flow chart 100 of the process of detecting defects that impact the topography of the wafer 10 surface is presented. At step 102, in-line wafers are scanned and any defect data detected is stored for later comparison. The wafers are preferably scanned after predetermined process steps have been performed, as mentioned above. At step 104, a pareto of nominal wafer topography data is developed and stored for later comparison. At step 106, the most common defect types for the stored defect data are chosen. A process of elimination then begins where the chosen defect types are narrowed to identify the most likely cause of the observed defect.

The elimination process begins by calibrating a simulator at step 108 to match wafer topography for the nominal case. In the preferred embodiment, the Metropole simulator is used. At step 110, a plurality of defect simulations are executed by varying defect type, i.e., particle and bubble. Location (step 111a), size (step 111b) and composition (step 111c) of the defect are also varied as well. The simulated defect profiles are then compared at step 112 to the stored defect data. For each simulated defect profile, a comparison is made on whether it is a feasible or infeasible cause of the stored defective profile at step 114. Experiments are then performed at step 116 to narrow the range of feasible causes. Finally, at step 118 a solution is identified for the most likely defect profile, and the defect is corrected according to this solution at step 120.

Figure 9B:
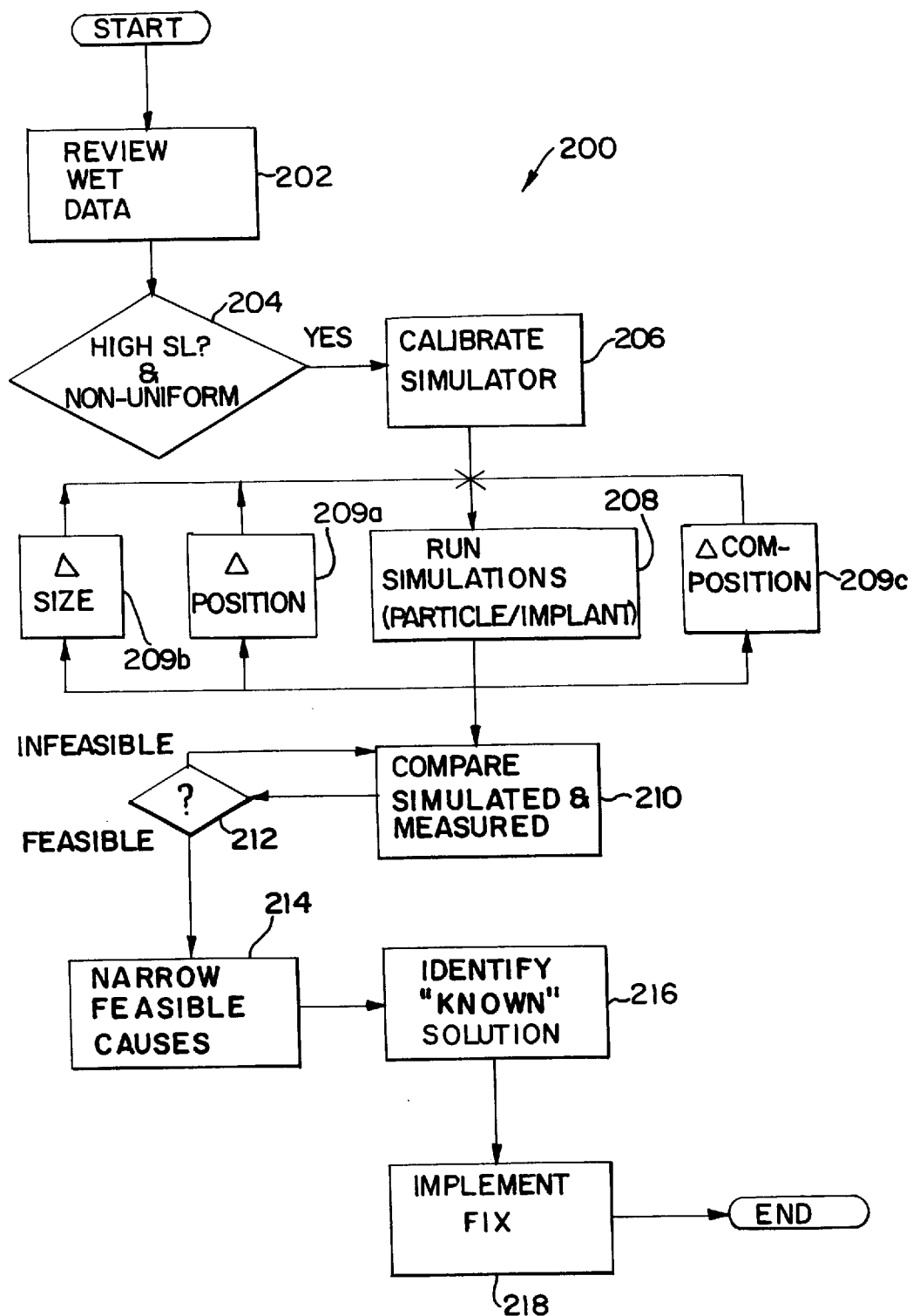

Referring now to FIG. 9(B), a flow chart 200 of the process of detecting defects that impact doping concentrations is presented. The process begins at step 202 where wafer electrical test ("WET") data is reviewed. If a significant number of wafer sites have high resistance, and the distribution is non-uniform, then the failure analysis routine begins at step 204. At step 206, a simulator is calibrated to match nominal WET data. In the presently preferred embodiment, the Metropole simulator is used. Plural defect simulations are performed at step 208 by varying particle types and implant types. Varying the position (step 209a), size (step 209b) and composition (step 209c) of the defect are also simulated.

The simulated electrical data are then compared at step 210 to the measured WET results. The simulated defect profiles are classified at step 212 as feasible or infeasible causes of the bad WET data. Tests are performed at step 214 to narrow down the range of feasible causes. Once a likely cause of the bad WET data is determined, a solution is identified at step 216, which is then implemented at step 218.

The invention provides a less costly and time consuming method for identifying various defects caused during the manufacture of IC wafers. Through the use of a defect simulation tool, such as the Metropole simulator, the impact of many different types of defects on photoresist profiles can be simulated and compared to in-line wafers. Defects such as bridging between photoresist lines caused by both very small bubbles and particles in the photoresist, as well as voids in the photoresist, caused by small bubbles or large particles on the photoresist surface, can be simulated and used for comparison to actual wafer defects. The automation of the process of detecting causes for observed wafer defects presents a useful advance over prior experimental techniques known in the art.

It is to be understood that a wide range of changes and modifications to the embodiments described above will be apparent to those skilled in the art and are contemplated. It is therefore intended that the foregoing detailed description be regarded as illustrative, rather than limiting, and that it be understood that it is the following claims, including all equivalents, that are intended to define the spirit and scope of the invention.

We claim:

1. A method of diagnosing defects that impact topography of an integrated circuit wafer surface, comprising the steps of:

scanning an integrated circuit wafer surface after predetermined processing steps have been performed on the wafer;

storing any defect data detected from the scanned wafer in a defect profile;

comparing the stored defect profile against a library of wafer surface defect types based on known wafer defect characteristics to identify a possible cause for the defect profile; and running predetermined experiments to narrow the number of feasible defect causes for the defect profile.

2. The method defined in claim 1, further comprising the step of fixing wafer surface defects according to known techniques based on the feasible defect causes identified.

3. The method defined in claim 1, wherein the step of running predetermined experiments comprises the step of classifying defect types obtained from the predetermined experiments as feasible or infeasible causes of the defect profile.

4. The method defined in claim 1, wherein the step of running predetermined experiments comprises the step of running plural simulations of known defects.

5. The method defined in claim 4, wherein the step of running plural simulations of known defects comprises varying both defect size and defect composition.

6. The method defined in claim 4, wherein the step of running plural simulations comprises the step of calibrating the simulator to match non-defective wafer topography.

7. The method defined in claim 4, wherein the step of running plural simulations comprises the step of simulating the defects caused by unintended particles in wafer processing.

8. The method defined in claim 4, wherein the step of running plural simulations comprises the step of simulating the defects caused by bubbles in wafer processing.

9. The method defined in claim 4, wherein the step of running plural simulations comprises the step of simulating the defects caused by foreign material in wafer processing.

10. The method defined in claim 4, wherein the step of running plural simulations comprises the step of simulating the defects caused by chemical reactions in wafer processing.

11. A method of developing a library of defects in integrated circuits, comprising the steps of:

calibrating a defect simulator to match nominal wafer data for a non-defective integrated circuit;

running plural defect simulations to determine the effect of changes in size and composition of known defects;

developing defect profiles of common defects and their characteristics based on the plural defect simulations and storing the defect profiles in a library;

comparing the defect profiles in the library against actual wafer defects;

classifying potential defect profiles as feasible or infeasible causes of the actual wafer defects based on the comparison; and running predetermined experiments to narrow the range of feasible causes for the actual defects.

12. The method defined in claim 11, wherein the step of running plural defect simulations comprises performing simulations for different exposure patterns.

13. The method defined in claim 11, wherein the step of running plural defect simulations comprises the step of simulating the defects caused by unintended particles in wafer processing.

14. The method defined in claim 11 wherein the step of running plural defect simulations comprises the step of simulating the defects caused by bubbles in wafer processing.

15. The method defined in claim 11 wherein the step of running plural defect simulations comprises the step of simulating the defects caused by foreign material in wafer processing.

16. The method defined in claim 11, wherein the step of running plural defect simulations comprises the step of simulating the defects caused by chemical reactions in wafer processing.

17. A method of detecting defects in integrated circuits that impact doping concentrations, comprising the steps of:
measuring integrated circuit wafer electrical test data;
determining if at least one wafer site demonstrates bad wafer electrical test data;
running a simulator, calibrated to match nominal wafer electrical test data, to perform plural defect simulations, and comparing simulated data with measured wafer electrical test data;
classifying defect simulation results as feasible or infeasible causes of the bad wafer electrical test data; and
performing predetermined tests to narrow the set of feasible causes of the bad wafer electrical test data by using different test structures.

18. The method defined in claim 17, further comprising the step of fixing the identified defect according to known techniques.

19. The method defined in claim 17, wherein the bad wafer electrical test data comprises high resistance.

20. The method defined in claim 17, wherein the bad wafer electrical test data comprises non-uniform distribution.

21. The method defined in claim 17, wherein the bad wafer electrical test data comprises undesirable device performances.

22. The method defined in claim 17, wherein the step of performing plural defect simulations comprises simulating particles blocking various types of wafer implants.

23. The method defined in claim 17, wherein the step of performing plural defect simulations comprises simulating particles blocking various types of wafer implants.

24. The method defined in claim 17, wherein the step of performing plural defect simulations comprises simulating changes in defect position.

25. The method defined in claim 17, wherein the step of performing plural defect simulations comprises simulating changes in defect size.

26. The method defined in claim 17, wherein the step of performing plural defect simulations comprises simulating changes in defect composition.

27. A method for fixing defects in an integrated circuit wafer, comprising the steps of:
simulating the effect caused by at least one known integrated circuit wafer defect;
storing the cause and associated effect of the at least one known integrated circuit wafer defect in an index;
measuring at least one actual integrated circuit wafer to detect the existence of any defect;
determining if the defect in the actual integrated circuit wafer is included in the index; and
identifying the defect in the actual integrated circuit wafer based on the cause of the defect stored in the index.

* * * * *